United States Patent [19]

Ladany

[11] Patent Number: 4,845,014
[45] Date of Patent: Jul. 4, 1989

[54] METHOD OF FORMING A CHANNEL
[75] Inventor: Ivan Ladany, Stockton, N.J.
[73] Assignee: RCA Corporation, Princeton, N.J.
[21] Appl. No.: 789,462
[22] Filed: Oct. 21, 1985
[51] Int. Cl.$^4$ ............................................. G03C 5/00
[52] U.S. Cl. ................................... 430/323; 430/324; 430/325; 430/326; 430/394; 372/48; 372/96
[58] Field of Search .................... 430/1, 2, 321, 323, 430/317, 316, 945, 320, 394, 324; 372/48, 96

[56] References Cited

U.S. PATENT DOCUMENTS

| | | |
|---|---|---|
| 2,854,336 | 9/1958 | Gutknecht . |
| 3,669,673 | 6/1972 | Chung Sen Ih et al. ........ 430/321 X |
| 4,023,993 | 5/1977 | Scifres et al. ..................... 148/172 |
| 4,099,999 | 7/1978 | Burnham et al. .................. 148/187 |
| 4,251,780 | 2/1981 | Scifres et al. ..................... 331/94.5 |
| 4,302,729 | 11/1981 | Burnham et al. ............... 331/94.5 H |
| 4,359,776 | 11/1982 | Acket et al. ........................ 372/46 |
| 4,369,513 | 1/1983 | Umeda et al. ...................... 372/46 |

FOREIGN PATENT DOCUMENTS

| | | | |
|---|---|---|---|
| 58-97888 | 6/1983 | Japan ................................... 372/48 |
| 58-219738 | 12/1983 | Japan ................................... 430/323 |
| 58-220486 | 12/1983 | Japan ................................... 372/48 |

OTHER PUBLICATIONS

Abita, Joseph L. "Improved Conventional Photolithography by Relief Mask Processing", *Solid State Technology*, pp. 48–49, Jun. 1974.
D. Marcuse, *Light Transmission Optics*, Chapter 2, "Diffraction Theory", Van Nostrand Reinhold Company, 1972, pp. 30–31.

*Primary Examiner*—John E. Kittle
*Assistant Examiner*—José G. Dees
*Attorney, Agent, or Firm*—Marvin Snyder; Fred Jacob; Harley R. Ball

[57] ABSTRACT

A method of forming a variable width channel in a body comprises the steps of forming a surface grating having a photoresist layer thereon. The photoresist layer has a plurality of depressions and a planar photomask is then positioned over the photoresist layer. The photoresist layer is subsequently exposed and developed and due to the divergence of light into the depressions covered by the photomask, forms a variable width opening. A portion of the body exposed in the opening is removed to form a channel with a sidewall having a surface contour corresponding to an edge of the opening.

14 Claims, 3 Drawing Sheets

METHOD OF FORMING A CHANNEL

The invention described herein was made in the performance of work under NASA contract No. NAS 1-17351 and is subject to the provisions of Section 305 National Aeronautics and Space Act of 1958 (72 Stat. 435; 42 U.S.C.2457).

The invention relates to a method of forming a channel having a variable width in a semiconductor body.

BACKGROUND OF THE INVENTION

Periodic corrugations are often useful in semiconductor devices. In particular, distributed feedback (DFB) lasers incorporate a periodic grating in the laser structure which provides spatial variations in the refractive index. When a DFB laser is electrically excited constructive interference of diffracted light gives rise to a stable single wavelength output. In semiconductor devices it is also often useful to form a channel to define an optical waveguide. J. T. Andrews et al. in U.S. patent application No. (RCA 80,171) entitled "DISTRIBUTED FEEDBACK LASER", filed concurrently herewith, disclose a DFB laser comprising a semiconductor body having opposed end faces and having a channel which varies in width. The variation in channel width is periodic in the longitudinal direction, the direction perpendicular to the end faces. As the desired length of each period is often less than one micrometer ($\mu$m) conventional photolithographic techniques to define the channel are generally unavailable.

Well-known holographic techniques have been used to form gratings with a period less than 1 $\mu$m in length. The gratings formed generally comprise a plurality of parallel periodic elements. As these gratings are formed on a planar surface of a structure they have been considered inapplicable in producing a channel in the structure which periodically varies in width. Thus, it would be desirable to have a method for producing a variable width channel.

SUMMARY OF THE INVENTION

A channel having a variable width may be produced in a body by positioning a planar photomask on a surface grating having a photoresist layer thereon. A masking pattern with a variable width opening therein is then formed in the photoresist layer. A portion of the body exposed in the opening is then removed to form a channel having a sidewall with a surface contour corresponding to an edge of the photoresist pattern.

DESCRIPTION OF THE PREFERRED EMBODIMENTS

Figure 1:
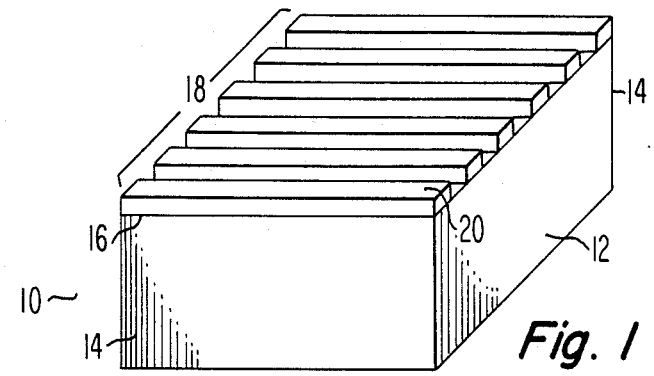
FIGS. 1–6 are perspective views of a body during sequential steps in the process of forming a variable width channel.

In FIG. 1 a structure 10 comprises a body 12 having a pair of end faces 14 with a major surface 16 extending therebetween. A photoresist grating pattern 18 overlies the major surface 16. Typically the grating pattern 18 will comprise a plurality of substantially parallel, linear photoresist lines 20 extending in the lateral direction, a direction in the plane of both the major surface and the end faces. The grating pattern 18 may be composed of a positive or a negative type photoresist. Suitable resists include, for example, novolac-diazoquinone sensitizer preparations such as a Microposit Photoresist of the Shipley Company.

Figure 2:
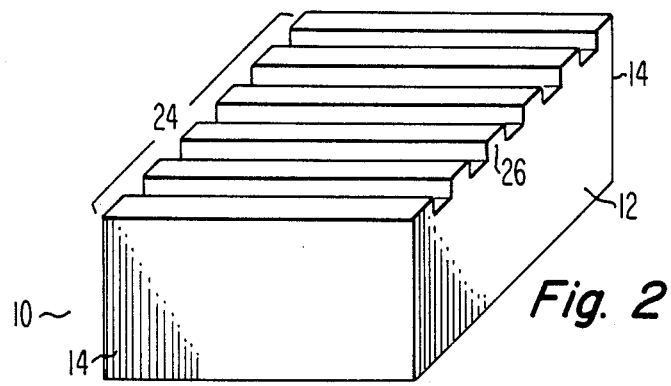

Portions of the body 12 exposed in the photoresist grating pattern 18 are then removed using either a wet or dry etching process and the photoresist grating pattern is then subsequently removed to form a surface grating 24 in the body 12, as shown in FIG. 2. The surface grating 24 preferably comprises a plurality of substantially parallel elements 26 extending in the lateral direction which are equally spaced apart and are of about the same width in the longitudinal direction. The desired amplitude of the surface grating 24 is typically determined experimentally and is generally between about 0.06 and 0.1 $\mu$m.

Figure 3:
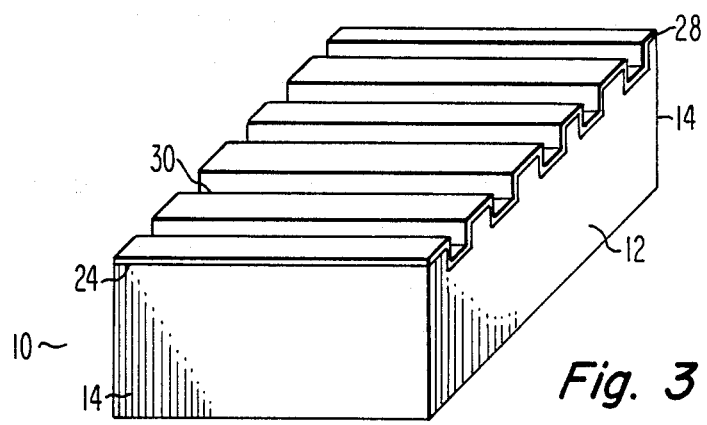

A photoresist layer 28 is then formed over the surface grating 24 as shown in FIG. 3. Preferably, the photoresist layer 28 conforms to the contour of the surface grating 24 and may be either a positive or a negative type photoresist. Typically, the photoresist layer 28 partially fills in the surface grating 24 resulting in the surface of the photoresist layer 28 having a plurality of depressions 30. Generally, the photoresist is applied by spin-coating to a thickness which is typically determined experimentally and is generally between about 0.05 and 0.5 $\mu$m.

Figure 4:
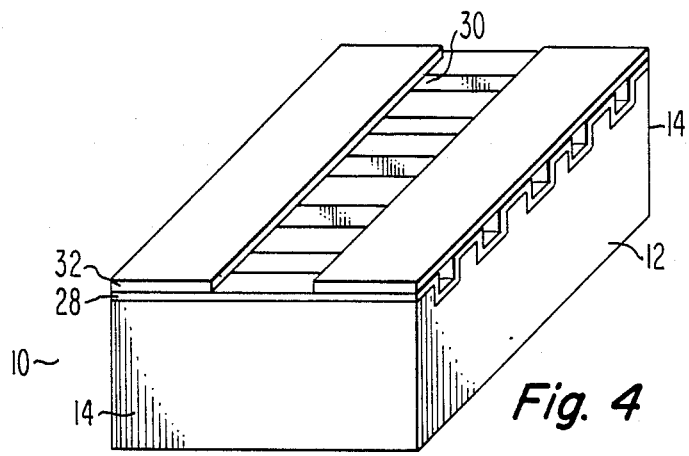

A substantially planar photomask 32 is then positioned on the photoresist layer 28 such that the photomask 32 does not contact the photoresist layer in the area of the depressions 30. If the photoresist layer 28 is a positive photoresist, the photomask 32 will typically comprise a pair of spaced apart linear masks extending between the end faces 14, thereby defining the channel region, typically about 2 $\mu$m in width in the lateral direction, as depicted in FIG. 4. If the photoresist layer 28 is a negative photoresist, the photomask will typically be a single linear mask extending between the end faces 14 defining the channel region.

Figure 5:
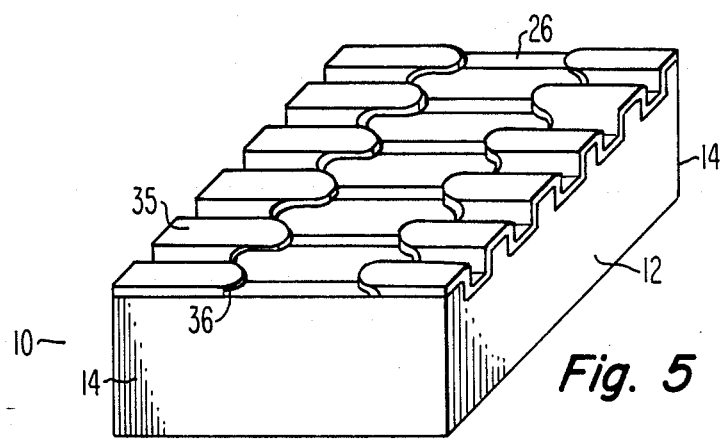

The photoresist layer 28 is then exposed such that light is incident in the depressions 30 covered by the edge of the photomask 32. The divergence of light which occurs in the space between the photomask 32 and the depressions 30 causes light to impinge on the photoresist layer 28 in the depressions 30 covered by the photomask 32 during the exposure process. The photoresist layer 28 is then developed, resulting in a photoresist pattern 35 having a variable width opening 36 which intersects a plurality of elements 26. If a negative type photoresist layer 28 is used, then the width variations in the lateral direction of the opening 36 will be narrower than the portion of the photomask defining the channel region. Alternatively, if a positive photoresist layer 28 is used, then the width variations of the opening 36 will be wider than the portion of the photomask 32 defining the channel region, as shown in FIG. 5.

Figure 6:
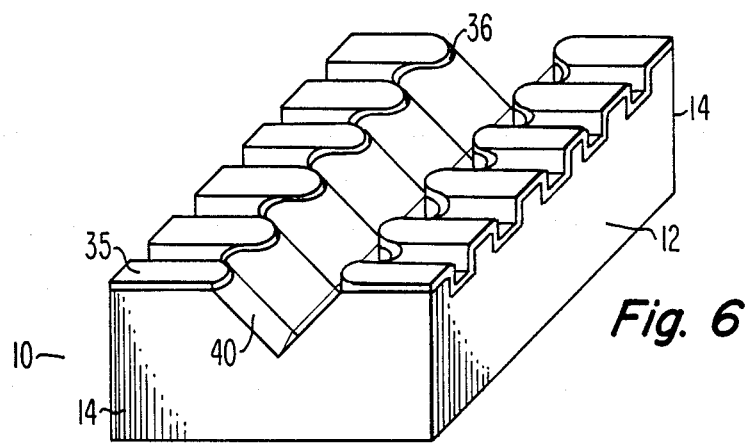

Portions of the body 12, exposed in the variable width opening 36, are then removed to form a variable width channel 40 with the sidewalls having a surface contour which corresponds to the edges of the photoresist pattern 35, as shown in FIG. 6. Typically, the surface contour of the sidewalls varies periodically in the longitudinal direction with a period which is dependent on the width and spacing of the elements 20. Generally, a chemical etchant such as HCl:H$_3$PO$_4$ is used to form the channel 40.

Alternatively, a dielectric layer such as silicon dioxide may be formed over the surface grating 24. The photoresist layer 28 is then formed over the dielectric layer and the planar photomask 32 is positioned thereon. The photoresist layer 28 is then exposed and developed to form a mask for forming a variable width striped opening in the dielectric layer. The dielectric layer, with the striped opening therein, then serves as a mask for etching the channel 40 in the body 12.

Figure 7:
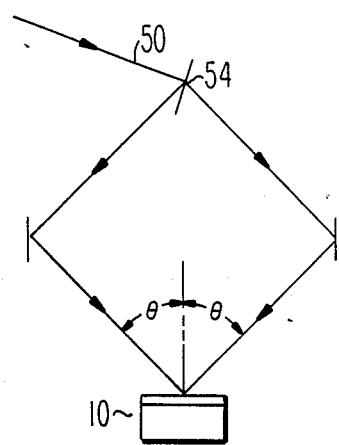
FIG. 7 is a schematic diagram of an exposure technique in the process of forming a grating pattern.

Preferably, the photoresist grating pattern 18 is formed by using holographic techniques. Typically, a laser emits a coherent light beam 50 which is split into two beams by a beam splitter 54. The light is then directed toward the surface of the structure 10, having a photoresist layer thereon. The interference of the two beams creates a periodic exposure of the photoresist as defined by $$\Lambda = \lambda/(2\sin\theta)$$

where $\Lambda$ is the length of each period, $\lambda$ is the wavelength of the emitted laser beam and $\theta$ is the angle of incidence of the beams as shown in FIG. 7.

After the channel 40 has been etched the structure 10 may be used as a substrate in forming a laser such as that disclosed by J. T. Andrews et al. in U.S. patent application No. (RCA 80,171) entitled "DISTRIBUTED FEEDBACK LASER", filed concurrently herewith.

Although the principles of the invention have been described in relation to the structure 10, it is to be understood that these principles are applicable to other structures incorporating alternative materials, layer structures and channel shapes such as rectangular or dove-tail shapes.

We claim:

1. A method of forming a variable width channel in a body having a pair of opposed end faces and a major surface extending therebetween, which comprises the steps of:
    forming a surface grating in said major surface, said surface grating comprising a plurality of elements;
    forming a photoresist layer having a plurality of depression therein over said surface grating, the contour of said photoresist layer substantially corresponding to the contour of said grating;
    positioning a substantially planar non-variable width photomask which defines a non-variable width channel region, over photoresist layer such that the photomask does not contact the photoresist layer in the depression thereby forming a space sufficient for divergence of radiation between said photomask and said photomask layer;
    exposing to light said photoresist in the non-photomasked region which defines the channel region and at least a portion of the photoresist in the depressions underlying said photomask such that the non-variable width photomask forms a masking pattern having an opening with a plurality of variations in width and which intersect a plurality of elements, said variations in width in the opening substantially corresponding to the position of said elements; and
    removing a portion of said body exposed in the variable width opening to form a channel having at least one sidewall with a surface contour corresponding to an edge of said masking pattern said channel having a plurality of variations in width which substantially corresponding to the position of the elements.

2. The method of claim 1, wherein said elements are substantially parallel and extend in the lateral direction.

3. The method of claim 2, wherein said elements are about equally spaced apart and are about the same width.

4. The method of claim 1, further comprising the steps of:
    forming a conformal dielectric layer on said surface grating prior to forming said photoresist layer; and
    forming said masking pattern in both said photoresist layer and said dielectric layer.

5. The method of claim 4, wherein said dielectric layer is composed of silicon dioxide.

6. The method of claim 1, wherein said photoresist layer is composed of a positive type photoresist.

7. The method of claim 6, wherein the width variations of said opening are wider than the portion of said photomask defining said channel region.

8. The method of claim 1, wherein said photoresist layer is composed of a negative type photoresist.

9. The method of claim 8, wherein the width variations of said opening are narrower than the portion of said photomask defining the channel region.

10. The method of claim 1, wherein the variation in amplitude of the surface grating is between about 0.03 and 0.08 micrometers.

11. The method of claim 1, wherein a sidewall of said channel periodically varies in the longitudinal direction.

12. The method of claim 1, wherein the step of forming said surface grating, comprises the steps of:
    forming a photoresist layer on said major surface;
    exposing and developing said photoresist to form a photoresist grating; and
    removing a portion of said major surface exposed in said photoresist grating.

13. The method of claim 1, wherein said photoresist layer conforms to the contour of said surface grating.

14. The method of claim 1 wherein the step of exposing said photoresist further comprises exposing the photoresist such that light impinges on the photoresist layer in the depressions covered by the edge of the photomask.

* * * * *